United States Patent
Calafiore et al.

(10) Patent No.: US 10,996,382 B1
(45) Date of Patent: May 4, 2021

(54) DIFFRACTION GRATING WITH A VARIABLE REFRACTIVE INDEX FORMED USING AN ENERGY GRADIENT

(71) Applicant: Facebook Technologies, LLC, Menlo Park, CA (US)

(72) Inventors: Giuseppe Calafiore, Redmond, WA (US); Austin Lane, Redmond, WA (US); Matthew E. Colburn, Woodinville, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 15/878,230

(22) Filed: Jan. 23, 2018

(51) Int. Cl.
  *G02B 5/18* (2006.01)
  *G03F 7/00* (2006.01)
  *G02B 6/34* (2006.01)

(52) U.S. Cl.
  CPC ............. *G02B 5/1857* (2013.01); *G02B 6/34* (2013.01); *G03F 7/0005* (2013.01)

(58) Field of Classification Search
  CPC .... G02B 5/1857; G02B 6/34; G02B 6/02138; G03F 7/0005; B29D 11/00355
  See application file for complete search history.

(56) References Cited

U.S. PATENT DOCUMENTS

| | | | |
|---|---|---|---|
| 4,196,246 A | 4/1980 | Takayama et al. | |
| 4,934,788 A | 6/1990 | Southwell | |
| 5,291,332 A | 3/1994 | Siebert | |
| 5,428,635 A | 6/1995 | Zhiglinsky et al. | |
| 5,498,444 A | 3/1996 | Hayes | |
| 5,648,147 A | 7/1997 | Bischof et al. | |
| 5,694,230 A | 12/1997 | Welch | |
| 5,710,849 A | 1/1998 | Little et al. | |
| 5,799,231 A | 8/1998 | Gates et al. | |
| 5,876,902 A | 3/1999 | Veneklasen et al. | |
| 5,982,545 A | 11/1999 | Su | |
| 6,021,242 A | 2/2000 | Harumoto et al. | |
| 6,172,792 B1 | 1/2001 | Jepsen et al. | |
| 6,671,452 B2 | 12/2003 | Winston et al. | |
| 6,734,436 B2 | 5/2004 | Faris et al. | |
| 6,816,648 B2 | 11/2004 | Goldstein | |
| 7,876,504 B2 | 1/2011 | Vigier-Blanc et al. | |
| 8,168,373 B2 | 5/2012 | Shew | |
| 8,681,428 B1 | 3/2014 | Brown | |
| 8,958,141 B1 | 2/2015 | Brown | |
| 8,975,601 B1 | 3/2015 | Chen | |
| 9,354,363 B2 | 5/2016 | Wu et al. | |
| 9,378,926 B2 | 6/2016 | Kuo et al. | |
| 9,690,208 B2 | 6/2017 | Yu | |
| 10,288,775 B1 | 5/2019 | Keith et al. | |

(Continued)

OTHER PUBLICATIONS

U.S. Appl. No. 15/878,227, "Final Office Action", dated Mar. 9, 2020, 16 pages.

(Continued)

Primary Examiner — Moshe Wilensky
(74) Attorney, Agent, or Firm — Weaver Austin Villeneuve & Sampson LLP

(57) ABSTRACT

An optical device with a variable index of refraction is formed by exposing a film to an energy gradient. The optical device has angular selectivity. The optical device can be used as an output coupler for a waveguide used in a virtual-reality and/or augmented-reality apparatus.

15 Claims, 10 Drawing Sheets

(56) References Cited

U.S. PATENT DOCUMENTS

| | | | |
|---|---|---|---|
| 2004/0091642 | A1 | 5/2004 | Murakami et al. |
| 2005/0046957 | A1 | 3/2005 | Lai et al. |
| 2005/0057815 | A1 | 3/2005 | Lai et al. |
| 2006/0029348 | A1* | 2/2006 | Kempen ............... G02B 6/2821 385/129 |
| 2010/0002308 | A1 | 1/2010 | Vigier-Blanc et al. |
| 2010/0079865 | A1 | 4/2010 | Saarikko et al. |
| 2010/0195204 | A1 | 8/2010 | Walker |
| 2010/0277803 | A1 | 11/2010 | Pockett et al. |
| 2010/0321781 | A1 | 12/2010 | Levola et al. |
| 2011/0159309 | A1 | 6/2011 | Jiang et al. |
| 2011/0274393 | A1 | 11/2011 | Reed et al. |
| 2013/0032734 | A1* | 2/2013 | Santori ............... G02B 19/0052 250/458.1 |
| 2013/0058370 | A1 | 3/2013 | Chang-Hasnain et al. |
| 2013/0155514 | A1 | 6/2013 | Ushigome |
| 2013/0321900 | A1 | 12/2013 | Vallius et al. |
| 2014/0300966 | A1 | 10/2014 | Travers et al. |
| 2015/0029584 | A1 | 1/2015 | Song et al. |
| 2015/0361286 | A1 | 12/2015 | Williams |
| 2018/0052276 | A1 | 2/2018 | Klienman et al. |

OTHER PUBLICATIONS

"Blazed grating", Available Online At : https://en.wikipedia.org/wiki/Blazed_grating, Dec. 26, 2016, 3 pages.

"Electron-beam lithography", Available Online At: https://en.wikipedia.org/wiki/Electron-beam_lithography, Sep. 12, 2017, 7 pages.

"Grayscale Lithography", Available Online At: http://www.eng.auburn.edu/~sylee/gray.html, 2017, 1 page.

"Optical Components", Available Online At : https://microdevices.jpl.nasa.gov/capabilities/optical-components/process-for-3-d-surface-relief-profiles.php, 6 pages.

"Stitch-free Lithography", Available Online At: https://www.raith.com/technology/stitch-free-lithography.html, 2017, 1 page.

Kirchner, et al., "ZEP520A—A resist for electron-beam grayscale lithography and thermal reflow", Microelectronic Engineering, vol. 153, Mar. 5, 2016, 3 pages.

NIST, "New Grayscale Technique Opens a Third Dimension for Nanoscale Lithography", Available Online At: https://www.nist.gov/news-events/news/2013/08/new-grayscale-technique-opens-third-dimension-nanoscale-lithography, Aug. 28, 2013, 3 pages.

Yu, et al., "The evaluation of photo/e-beam complementary grayscale lithography for high topography 3D structure", Proc. SPIE 8682, Advances in Resist Materials and Processing Technology XXX, 868212, Available Online At: http://proceedings.spiedigitallibrary.org/proceeding.aspx?articleid=1674320, Mar. 29, 2013, 3 pages.

"Ion Implantation", retrieved from https://matenggroup.wordpress.com/ion-implantation/ and printed on Nov. 6, 2018.

"Inkjet printing", retrieved from https://en.wikipedia.org/wiki/Inkjet_printing and printed on Nov. 6, 2018.

U.S. Appl. No. 15/878,227, "Non-Final Office Action", dated Aug. 29, 2019, 14 pages.

U.S. Appl. No. 15/878,227, "Notice of Allowance", dated May 18, 2020, 10 pages.

U.S. Appl. No. 15/878,227, "Notice of Allowability", dated Jul. 1, 2020, 6 pages.

U.S. Appl. No. 15/878,227, "Notice of Allowability", dated Aug. 19, 2020, 6 pages.

U.S. Appl. No. 15/878,232, "Non-Final Office Action", dated Feb. 6, 2020, 14 pages.

U.S. Appl. No. 15/878,232, "Final Office Action", dated Jul. 15, 2020, 15 pages.

\* cited by examiner

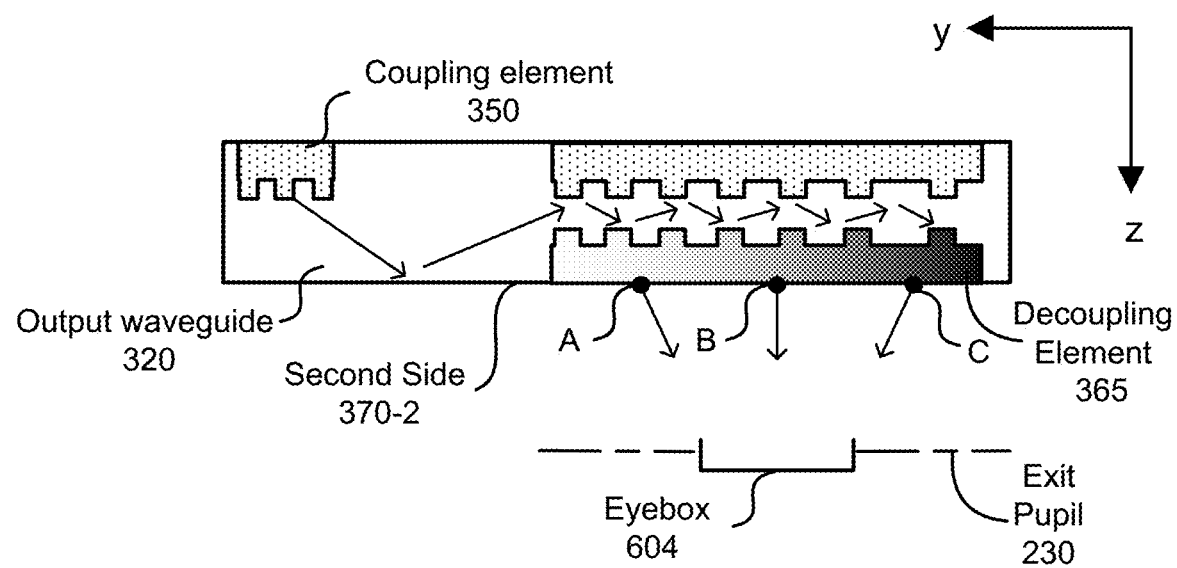
FIG. 6
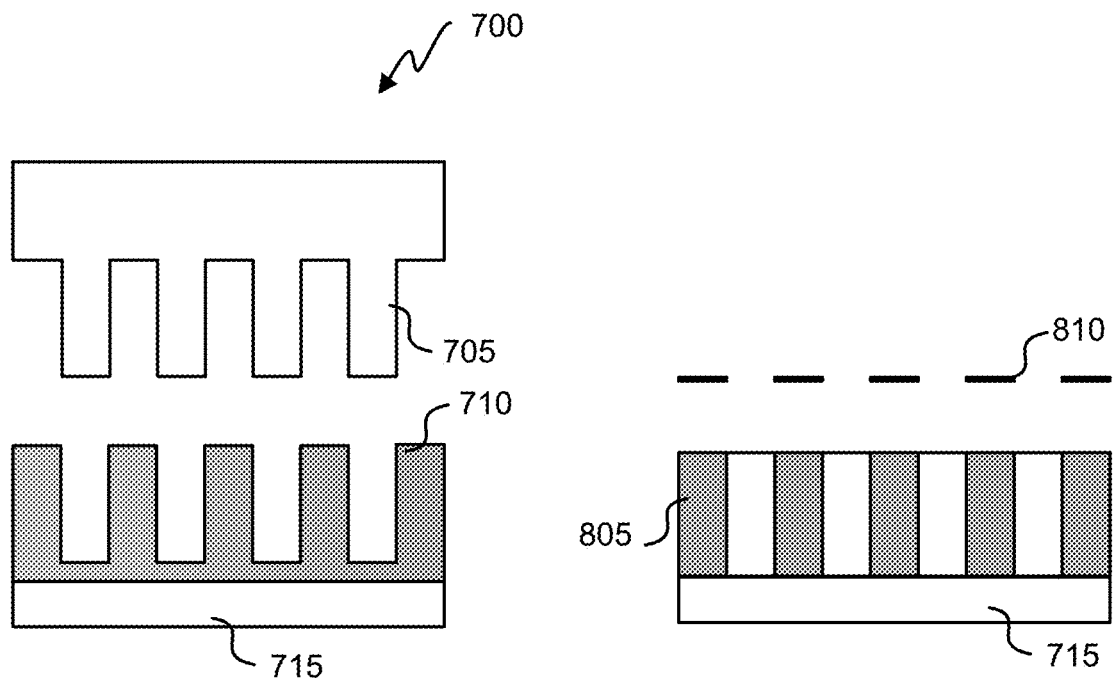
FIG. 7
FIG. 8

DIFFRACTION GRATING WITH A VARIABLE REFRACTIVE INDEX FORMED USING AN ENERGY GRADIENT

CROSS-REFERENCES TO RELATED APPLICATIONS

The following three U.S. patent applications (including this one) are being filed concurrently, and the entire disclosure of the other applications are incorporated by reference into this application for all purposes:

Application Ser. No. 15/878,227, filed Jan. 23, 2018, entitled "Diffraction Grating with a Variable Refractive Index Using Multiple Resins";

Application Ser. No. 15/878,230, filed Jan. 23, 2018, entitled "Diffraction Grating with a Variable Refractive Index Formed Using an Energy Gradient"; and Application Ser. No. 15/878,232, filed Jan. 23, 2018, entitled "Diffraction Grating with a Variable Refractive Index Using Ion Implantation."

BACKGROUND

The disclosure relates generally to near-eye-display systems, and more specifically to waveguide displays with a small form factor, a large field of view, and/or a large eyebox. Near-eye, light-field displays project images directly into a user's eye, encompassing both near-eye displays and electronic viewfinders. Conventional near-eye displays generally have a display element that generates image light that passes through one or more lenses before reaching a user's eyes. Additionally, near-eye displays in virtual-reality (VR) systems and/or augmented-reality (AR) systems have design criteria to be compact, be lightweight, and provide two-dimensional expansion with a large eyebox and a wide field-of-view (FOV). In typical near-eye displays, a limit for the FOV is based on satisfying two physical conditions: (1) an occurrence of total internal reflection of image light coupled into a waveguide, and (2) an existence of a first-order diffraction caused by a diffraction grating. Conventional methods used to satisfy the above two physical conditions rely on heavy and expensive components. Further, designing a conventional near-eye display with two-dimensional expansion involving two different output-grating elements that are spatially separated often results in a large form factor. Accordingly, it is challenging to design near-eye displays using conventional methods to achieve a small form factor, a large FOV, and/or a large eyebox.

SUMMARY

The present disclosure relates generally to an optical device with a variable index of refraction. More specifically, and without limitation, this disclosure relates to an optical grating with a variable index of refraction.

In some embodiments, a method of creating an optical device with a variable index of refraction for angular selectivity comprises depositing a film on a substrate; patterning the film to create an optical structure; and/or exposing the optical structure to an energy gradient, as part of a process to form a refractive-index gradient in the optical structure corresponding to the energy gradient. In some embodiments, the process further comprises exposing the optical structure to a compound as part of the process to form the refractive-index gradient; forming an overcoat on the optical structure; using a gray-tone mask and ultra-violet (UV) light to form a light gradient (e.g., dose up to 10 J/cm$^2$; and/or from 0.1-100 J/cm$^2$); exposing the film to flood UV light; and/or depositing a moiety that has a lower refractive index than the film; incorporating a depolymerizable oligomer or polymer into the film. In some embodiments, the compound has a higher refractive index than the film had before the film is exposed to the compound; the optical structure is a grating; the film is an imprint resist; the patterning the film comprises imprinting the film with a template to create the optical structure; the film is a photoresist; patterning the film comprises using photolithography to remove at least a portion of the film to form the optical structure; the film comprises a reactive monomer; the film comprises a photoacid generator; the energy gradient is a thermal gradient; the energy gradient is a light gradient; the film comprises a metal oxide sol-gel precursor; and/or the energy gradient is a thermal gradient produced by a hot plate (e.g., temperatures ranging from 25 to 350° C.). In some embodiments, the optical structure is a grating, and the method further comprises integrating the grating into a device used in a virtual reality and/or an augmented-reality system, wherein: the virtual reality and/or the augmented-reality system comprises: an optical source, a waveguide, an optical coupler configured to couple light from the optical source into the waveguide, and an output coupler configured to couple light out of the waveguide; the waveguide is a planar waveguide; and the grating is part of the output coupler.

In some embodiments, a method of creating an optical device with a variable index of refraction for angular selectivity comprises depositing a film on a substrate; exposing the film to UV light using a gray-tone mask; developing the film using a solvent to create a variable refractive index in the film; and/or patterning the film to create an optical structure after developing the film. In some embodiments, the film is a block copolymer and/or patterning the film comprises applying a photoresist to the film, exposing the photoresist, partially removing the photoresist based on applying the photoresist, and/or etching the film to create the optical structure.

In some embodiments, a device used in a virtual reality and/or an augmented-reality system comprises an optical source; a waveguide, wherein the waveguide is a planar waveguide; an optical coupler configured to couple light from the optical source into the waveguide; an output coupler configured to couple light out of the waveguide; and/or a grating, as part of the output coupler, wherein the grating has a varying refractive index.

BRIEF DESCRIPTION OF THE DRAWINGS

Illustrative embodiments are described with reference to the following figures.

FIG. 6 is a block diagram of an embodiment of an output coupler with angular selectivity.

FIG. 7 illustrates an embodiment of imprinting a film using a template to form an optical structure.

FIG. 8 illustrates an embodiment of masking a photoresist.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

This disclosure relates generally to optical devices. More specifically, and without limitation, this disclosure relates to optical devices having a refractive index that varies. In some embodiments, a grating structure with a variable refractive index is useful as an output coupler of a waveguide. A variable refractive index grating can be produced by multiple lithographic exposures to: 1) define the grating structure, and/or 2) define a concentration of gradient of chemically reactive sites that can be modified with high or low refractive index compounds after the first lithography step. Variable refractive index gratings can also be produced by depositing a variable refractive index film of monomeric resin or polymer, which can then be patterned into a grating structure using traditional photolithography, electron-beam lithography, nanoimprint, and/or nanoimprint lithography. The refractive index gradient can be produced in either one dimension or two dimensions in various and/or arbitrary shapes for a gradient profile (e.g., limited to resolution of photolithography and/or electron-beam lithography).

Figure 1:
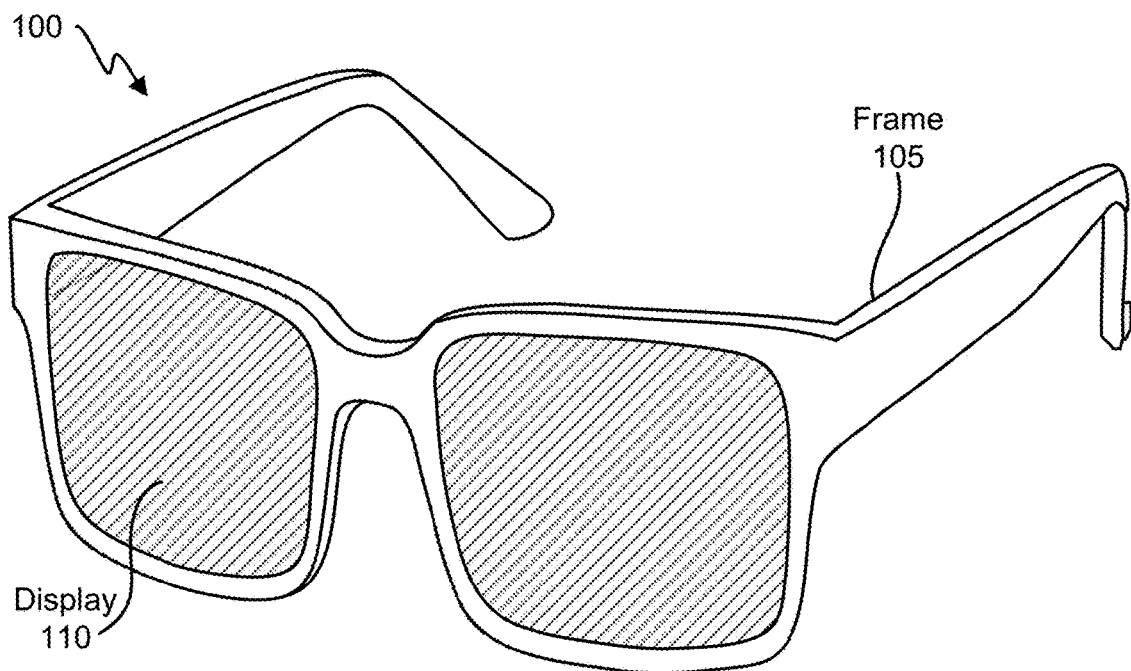
FIG. 1 is a diagram of an embodiment of a near-eye display.

FIG. 1 is a diagram of an embodiment of a near-eye display 100. The near-eye display 100 presents media to a user. Examples of media presented by the near-eye display 100 include one or more images, video, and/or audio. In some embodiments, audio is presented via an external device (e.g., speakers and/or headphones) that receives audio information from the near-eye display 100, a console, or both, and presents audio data based on the audio information. The near-eye display 100 is generally configured to operate as a virtual reality (VR) display. In some embodiments, the near-eye display 100 is modified to operate as an augmented reality (AR) display and/or a mixed reality (MR) display.

The near-eye display 100 includes a frame 105 and a display 110. The frame 105 is coupled to one or more optical elements. The display 110 is configured for the user to see content presented by the near-eye display 100. In some embodiments, the display 110 comprises a waveguide display assembly for directing light from one or more images to an eye of the user.

Figure 2:
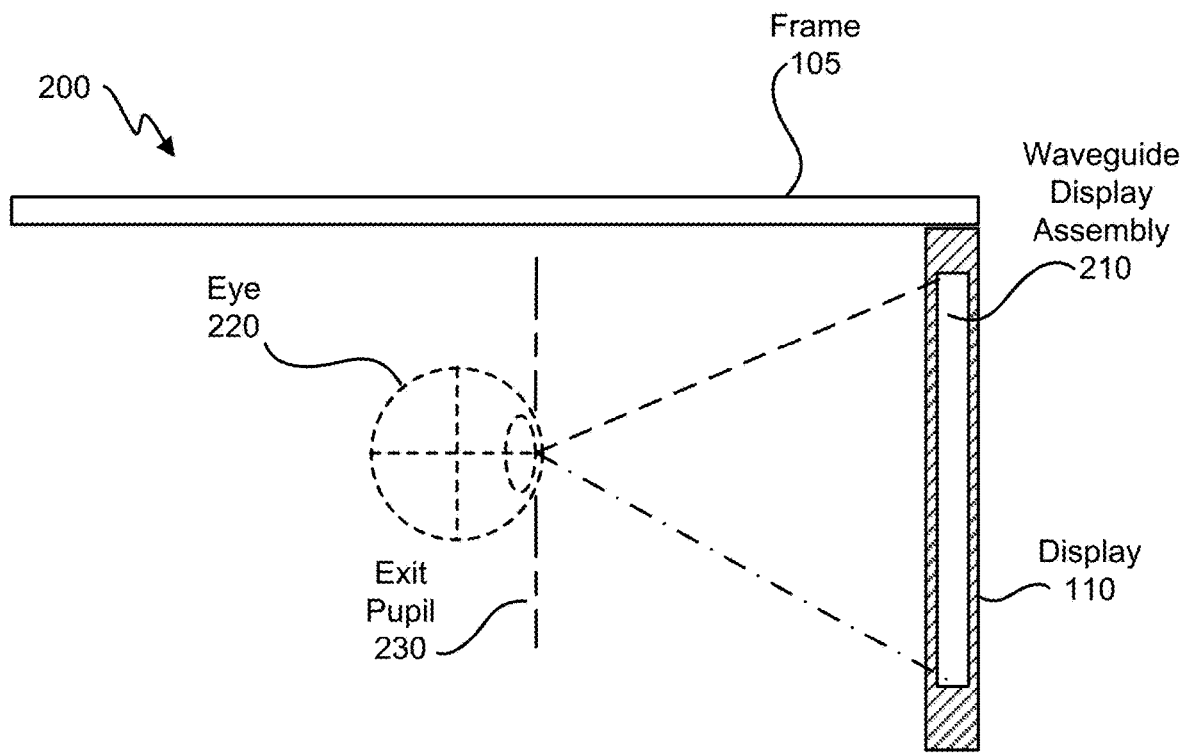
FIG. 2 is an embodiment of a cross section of the near-eye display.

FIG. 2 is an embodiment of a cross section 200 of the near-eye display 100 illustrated in FIG. 1. The display 110 includes at least one waveguide display assembly 210. An exit pupil 230 is a location where the eye 220 is positioned in an eyebox region when the user wears the near-eye display 100. For purposes of illustration, FIG. 2 shows the cross section 200 associated with a single eye 220 and a single waveguide display assembly 210, but a second waveguide display is used for a second eye of a user.

The waveguide display assembly 210 is configured to direct image light to an eyebox located at the exit pupil 230 and to the eye 220. The waveguide display assembly 210 may be composed of one or more materials (e.g., plastic, glass, etc.) with one or more refractive indices. In some embodiments, the near-eye display 100 includes one or more optical elements between the waveguide display assembly 210 and the eye 220.

In some embodiments, the waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g. multi-planar colored display). In some configurations, the stacked waveguide display is a monochromatic display that can be projected on multiple planes (e.g. multi-planar monochromatic display). The varifocal waveguide display is a display that can adjust a focal position of image light emitted from the waveguide display. In alternate embodiments, the waveguide display assembly 210 may include the stacked waveguide display and the varifocal waveguide display.

Figure 3:
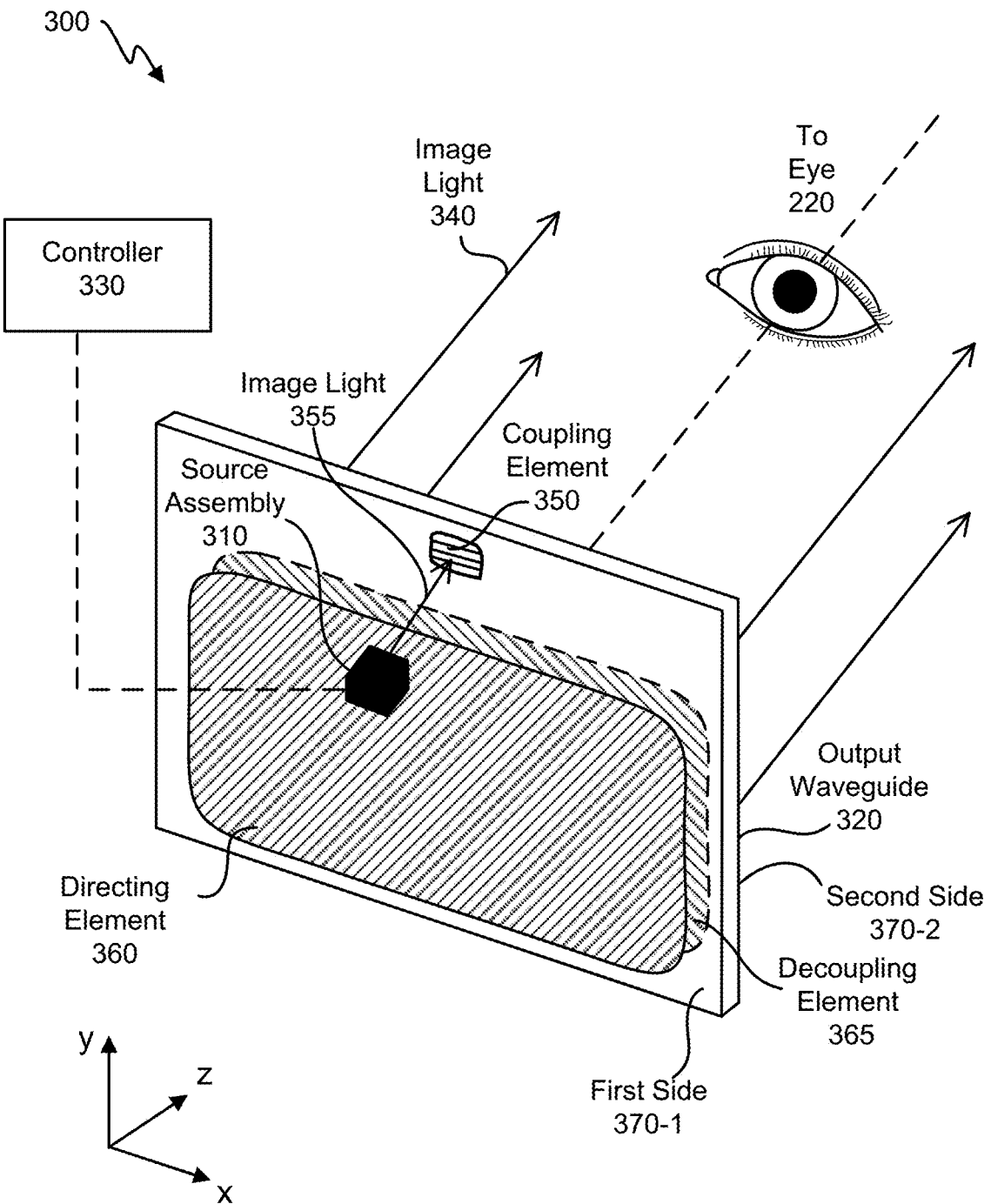
FIG. 3 illustrates an isometric view of an embodiment of a waveguide display with a single source assembly.

FIG. 3 illustrates an isometric view of an embodiment of a waveguide display 300. In some embodiments, the waveguide display 300 is a component (e.g., the waveguide display assembly 210) of the near-eye display 100. In some embodiments, the waveguide display 300 is part of some other near-eye display or other system that directs image light to a particular location.

The waveguide display 300 includes a source assembly 310, an output waveguide 320, and a controller 330. For purposes of illustration, FIG. 3 shows the waveguide display 300 associated with a single eye 220, but in some embodiments, another waveguide display separate, or partially separate, from the waveguide display 300 provides image light to another eye of the user.

The source assembly 310 generates image light 355. The source assembly 310 generates and outputs the image light 355 to a coupling element 350 located on a first side 370-1 of the output waveguide 320. The output waveguide 320 is an optical waveguide that outputs expanded image light 340 to an eye 220 of a user. The output waveguide 320 receives the image light 355 at one or more coupling elements 350 located on the first side 370-1 and guides received input image light 355 to a directing element 360. In some embodiments, the coupling element 350 couples the image light 355 from the source assembly 310 into the output waveguide 320. The coupling element 350 may be, e.g., a diffraction grating, a holographic grating, one or more cascaded reflectors, one or more prismatic surface elements, and/or an array of holographic reflectors.

The directing element 360 redirects the received input image light 355 to the decoupling element 365 such that the received input image light 355 is decoupled out of the output waveguide 320 via the decoupling element 365. The directing element 360 is part of, or affixed to, the first side 370-1 of the output waveguide 320. The decoupling element 365 is part of, or affixed to, the second side 370-2 of the output waveguide 320, such that the directing element 360 is opposed to the decoupling element 365. The directing element 360 and/or the decoupling element 365 may be, e.g., a diffraction grating, a holographic grating, one or more cascaded reflectors, one or more prismatic surface elements, and/or an array of holographic reflectors.

The second side 370-2 represents a plane along an x-dimension and a y-dimension. The output waveguide 320 may be composed of one or more materials that facilitate total internal reflection of the image light 355. The output waveguide 320 may be composed of e.g., silicon, plastic, glass, and/or polymers. The output waveguide 320 has a relatively small form factor. For example, the output waveguide 320 may be approximately 50 mm wide along x-dimension, 30 mm long along y-dimension and 0.5-1 mm thick along a z-dimension.

The controller 330 controls scanning operations of the source assembly 310. The controller 330 determines scanning instructions for the source assembly 310. In some embodiments, the output waveguide 320 outputs expanded image light 340 to the user's eye 220 with a large field of view (FOV). For example, the expanded image light 340 provided to the user's eye 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Figure 4:
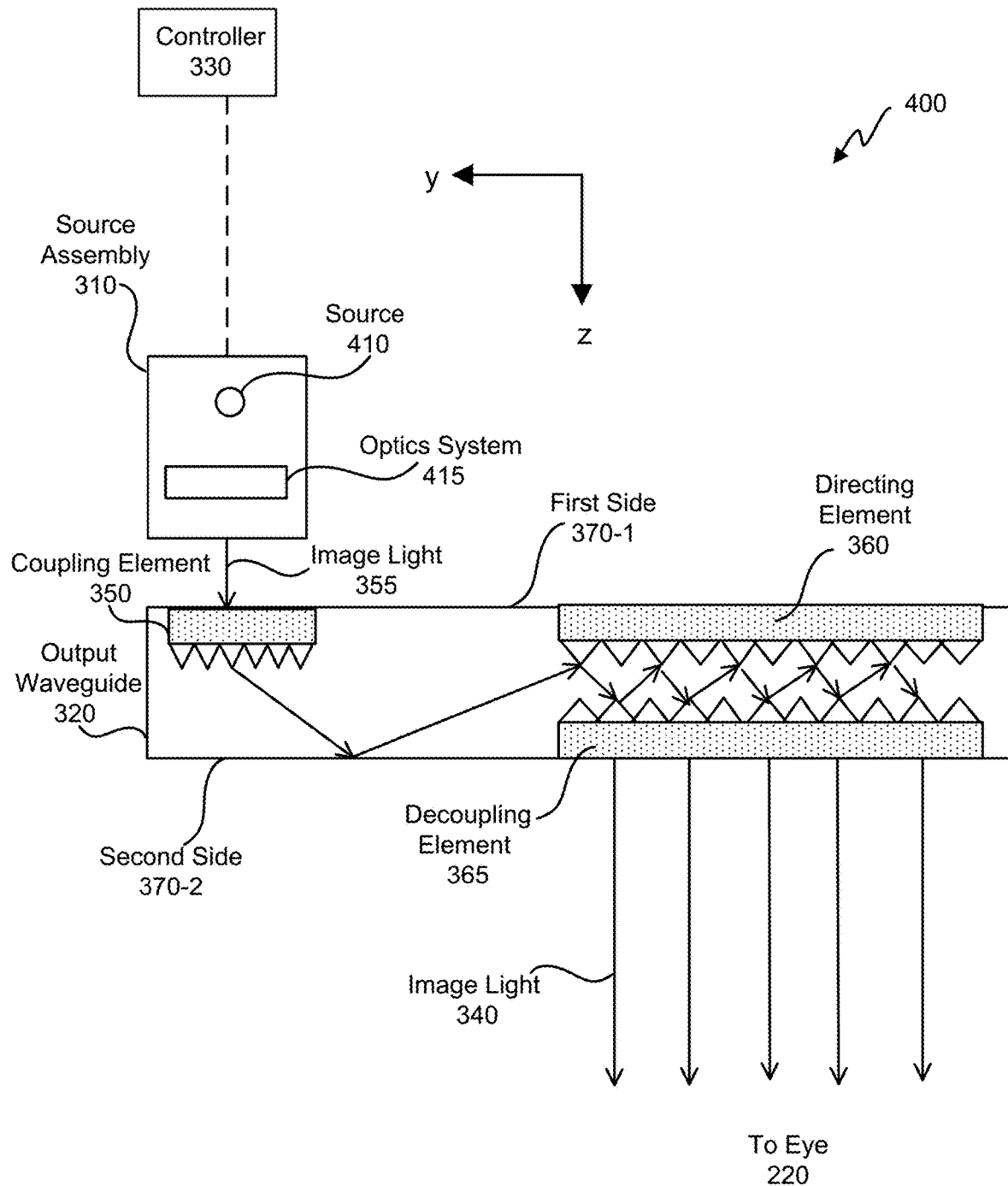
FIG. 4 illustrates a cross section of an embodiment of the waveguide display.

FIG. 4 illustrates an embodiment of a cross section 400 of the waveguide display 300. The cross section 400 includes the source assembly 310 and the output waveguide 320. The source assembly 310 generates image light 355 in accordance with scanning instructions from the controller 330. The source assembly 310 includes a source 410 and an optics system 415. The source 410 is a light source that generates coherent or partially coherent light. The source 410 may be, e.g., a laser diode, a vertical cavity surface emitting laser, and/or a light emitting diode.

The optics system 415 includes one or more optical components that condition the light from the source 410. Conditioning light from the source 410 may include, e.g., expanding, collimating, and/or adjusting orientation in accordance with instructions from the controller 330. The one or more optical components may include one or more lens, liquid lens, mirror, aperture, and/or grating. In some embodiments, the optics system 415 includes a liquid lens with a plurality of electrodes that allows scanning a beam of light with a threshold value of scanning angle to shift the beam of light to a region outside the liquid lens. Light emitted from the optics system 415 (and also the source assembly 310) is referred to as image light 355.

The output waveguide 320 receives the image light 355. The coupling element 350 couples the image light 355 from the source assembly 310 into the output waveguide 320. In embodiments where the coupling element 350 is diffraction grating, a pitch of the diffraction grating is chosen such that total internal reflection occurs in the output waveguide 320, and the image light 355 propagates internally in the output waveguide 320 (e.g., by total internal reflection), toward the decoupling element 365.

The directing element 360 redirects the image light 355 toward the decoupling element 365 for decoupling from the output waveguide 320. In embodiments where the directing element 360 is a diffraction grating, the pitch of the diffraction grating is chosen to cause incident image light 355 to exit the output waveguide 320 at angle(s) of inclination relative to a surface of the decoupling element 365.

In some embodiments, the directing element 360 and/or the decoupling element 365 are structurally similar. The expanded image light 340 exiting the output waveguide 320 is expanded along one or more dimensions (e.g., may be elongated along x-dimension). In some embodiments, the waveguide display 300 includes a plurality of source assemblies 310 and a plurality of output waveguides 320. Each of the source assemblies 310 emits a monochromatic image light of a specific band of wavelength corresponding to a primary color (e.g., red, green, or blue). Each of the output waveguides 320 may be stacked together with a distance of separation to output an expanded image light 340 that is multi-colored.

Figure 5:
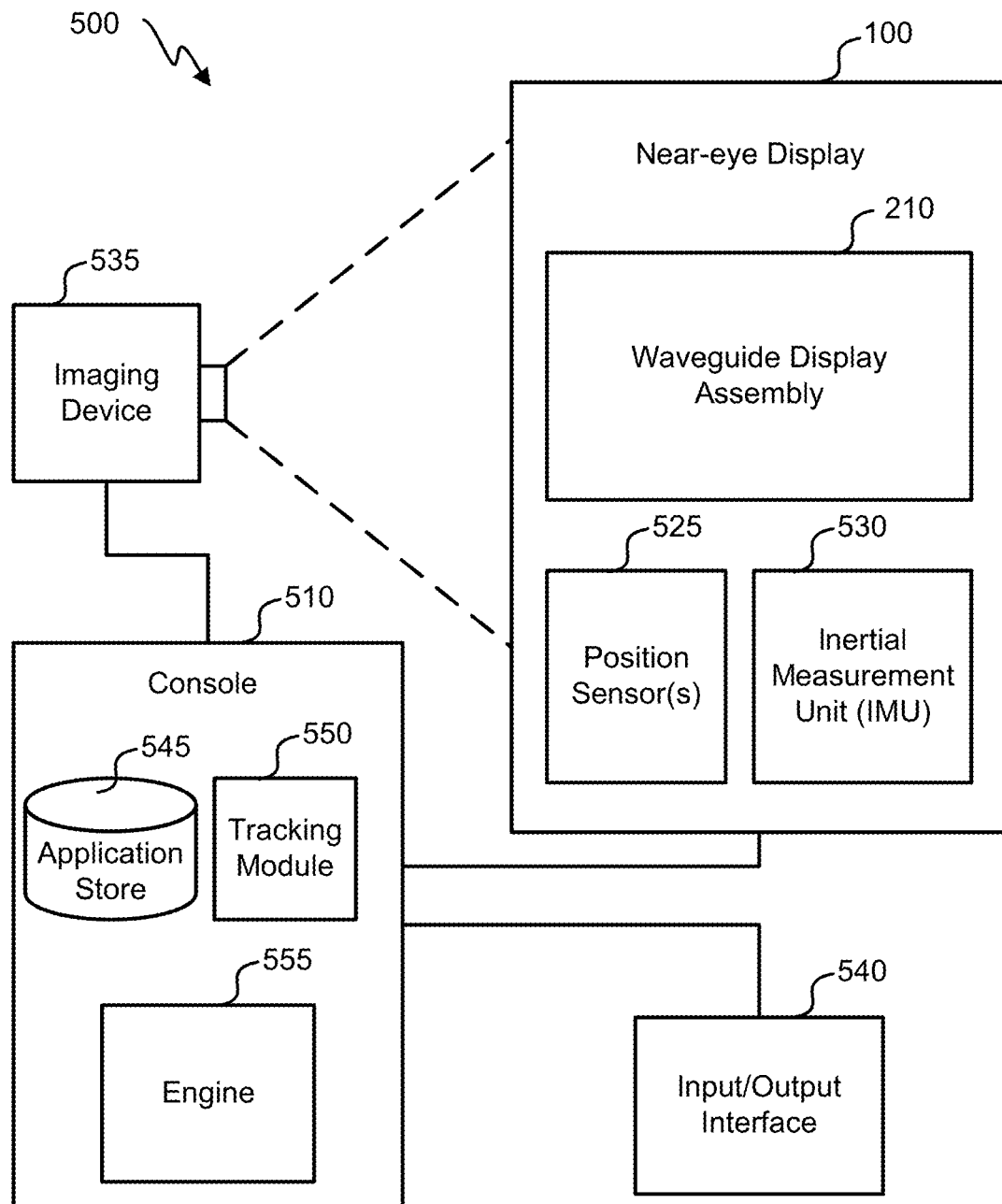
FIG. 5 is a block diagram of an embodiment of a system including the near-eye display.

FIG. 5 is a block diagram of an embodiment of a system 500 including the near-eye display 100. The system 500 comprises the near-eye display 100, an imaging device 535, and an input/output interface 540 that are each coupled to a console 510.

The near-eye display 100 is a display that presents media to a user. Examples of media presented by the near-eye display 100 include one or more images, video, and/or audio. In some embodiments, audio is presented via an external device (e.g., speakers and/or headphones) that receives audio information from the near-eye display 100 and/or the console 510 and presents audio data based on the audio information to a user. In some embodiments, the near-eye display 100 may also act as an AR eyewear glass. In some embodiments, the near-eye display 100 augments views of a physical, real-world environment, with computer-generated elements (e.g., images, video, sound, etc.).

The near-eye display 100 includes a waveguide display assembly 210, one or more position sensors 525, and/or an inertial measurement unit (IMU) 530. The waveguide display assembly 210 includes the source assembly 310, the output waveguide 320, and the controller 330.

The IMU 530 is an electronic device that generates fast calibration data indicating an estimated position of the near-eye display 100 relative to an initial position of the near-eye display 100 based on measurement signals received from one or more of the position sensors 525.

The imaging device 535 generates slow calibration data in accordance with calibration parameters received from the console 510. The imaging device 535 may include one or more cameras and/or one or more video cameras.

The input/output interface 540 is a device that allows a user to send action requests to the console 510. An action request is a request to perform a particular action. For example, an action request may be to start or end an application or to perform a particular action within the application.

The console 510 provides media to the near-eye display 100 for presentation to the user in accordance with information received from one or more of: the imaging device 535, the near-eye display 100, and the input/output interface 540. In the example shown in FIG. 5, the console 510 includes an application store 545, a tracking module 550, and an engine 555.

The application store 545 stores one or more applications for execution by the console 510. An application is a group of instructions, that when executed by a processor, generates content for presentation to the user. Examples of applications include: gaming applications, conferencing applications, video playback application, or other suitable applications.

The tracking module 550 calibrates the system 500 using one or more calibration parameters and may adjust one or more calibration parameters to reduce error in determination of the position of the near-eye display 100.

The tracking module 550 tracks movements of the near-eye display 100 using slow calibration information from the imaging device 535. The tracking module 550 also determines positions of a reference point of the near-eye display 100 using position information from the fast calibration information.

The engine 555 executes applications within the system 500 and receives position information, acceleration information, velocity information, and/or predicted future positions of the near-eye display 100 from the tracking module 550. In some embodiments, information received by the engine 555 may be used for producing a signal (e.g., display instructions) to the waveguide display assembly 210 that determines a type of content presented to the user.

FIG. 6 illustrates a cross section 600 of an embodiment of a waveguide display with angular selectivity. Angular selectivity addresses system-level efficiency. Cross section 600 includes the coupling element 350, the output waveguide 320, the decoupling element 365, and an eyebox 604, wherein the eyebox 604 is at the exit pupil 230. Light traveling from the coupling element 350 is transmitted through the output waveguide 320 and to the decoupling element 365. Light from the decoupling element 365 is selectively directed to the eyebox 604. The eyebox 604 is a usable area of light output from the decoupling element 365 at the exit pupil 230. In some embodiments, direction of light from the decoupling element 365 is not changed. In some embodiments, an intensity within a particular angular field of view is optimized. Gratings project light over a range of in-coupled angles. Extraction efficiency is increased for a particular field of view that hits the eyebox 604, thus minimizing light that cannot be seen by the eye. For example, light intensity distribution between modes of a grating is changed as a function of x and/or y so that more light is directed in a mode of the grating that is within the field of view of the eyebox 604.

Point A, point B, and point C are points along a plane of the decoupling element 365 where light is transmitted from the decoupling element 365 toward the eyebox 604. Point A is opposite point C. Point B is between point A and point C. The decoupling element 365 is a diffraction grating. The diffraction grating is configured to selectively change distribution of light emitted in modes of the diffraction grating. In FIG. 6, light from point A is primarily distributed in a mode directed down and to the right; light from point B is primarily distributed in a mode directed down (i.e., in a direction normal to the second side 370-2 of the output waveguide 320); and light from point C is primarily distributed in a mode directed down and to the left. Put another way, light from points A, B, and C can be defined by two vectors, a vector normal to the second side 370-2 and a lateral vector, wherein the lateral vector is orthogonal to the normal vector. The lateral vector of light from point A points in a direction opposite the lateral vector of light from point C; and a lateral vector of light from point B is zero (e.g., light from point B is in a direction of the normal vector of the second side 370-2). Thus light emitted from the decoupling element 365 is selectively directed to the eyebox 604 from point A, point B, and point C.

If light from the decoupling element 365 was not angularly directed, light from point A and/or point C would be transmitted in a direction parallel to light transmitted form point B (e.g., as shown in FIG. 4), and not as much light would enter the eyebox 604. Thus light from point B would appear brighter than light from point A and from point C. Thus if an image of a tree were centered in a field of view, a middle of a trunk of a tree might look bright, and leaves at a top of the tree and ground near a base of the tee (e.g., parts of a periphery of the image) might appear faded to a user. Parts of the periphery might appear faded because light intensity from pixels of the display 110 in the periphery (e.g., from point A and/or point C) would have less intensity reaching the eyebox 604 than light intensity from point B. For example, light from a first-order mode of a diffraction grating from points A and C would transmit parallel to a z-dimension and not selectively directed into the eyebox 604. In some embodiments, a lens is used to focus light from point A and/or point C into the eyebox 604. Yet a lens can be heavy to a user. Thus not using a lens, or using a thinner lens, improves a user's experience because the VR set is not as heavy.

In some embodiments, the decoupling element 365 is designed such that light from points between point A, point B, and/or point C are also selectively directed to the eyebox 604. In some embodiments, the output coupler (e.g., decoupling element 365) has a variable refractive index. In some embodiments, the decoupling element comprises a chirped grating (e.g., a grating with variable pitch).

In some embodiments, a system used for a virtual-reality and/or an augmented-reality display comprises: an optical source (e.g., source assembly 310); a waveguide (e.g., output waveguide 320); a coupling element (e.g., coupling element 350) configured to couple light from the optical source into the waveguide; and/or a decoupling element (e.g., decoupling element 365) configured to couple light out of the waveguide, wherein the decoupling element an optical element with a variable refractive index. The variable refractive index is configured to selectively direct light (e.g., modify light intensity) from the decoupling element 365 to the eyebox 604.

In some embodiments, an angular position of diffraction orders is defined by a period of a grating, wavelength of light, and/or a direction of incoming light. Shape, refractive index, height, and/or duty cycle of the grating do not change the angular position of the diffracted orders but can determine a distribution of energy in diffraction orders. To control a brightness, a uniformity, a field of view (FOV), and/or efficiency of an image projected to an eye of a user, design variables (e.g., grating period, wavelength of light, direction of incoming light, shape, refractive index, and/or duty cycle) of input and/or output diffraction gratings in a waveguide-based AR display can be controlled and/or varied across a pupil expander. In some embodiments, the output waveguide 320 is a planar waveguide (e.g., as opposed to a fiber-optic waveguide). In some embodiments, the device is defined by a length, and the refractive index gradient changes monotonically from high to low over the length of the device.

FIG. 7 illustrates an embodiment of imprinting a film using a template 705 to form an optical structure 710. The film is deposited on a substrate 715 (e.g., spin coating). In some embodiments, the substrate 715 is a semiconductor substrate. The film is a resist (e.g., an imprint resist configured to hold a shape after being pressed by the template 705). The template 705 is a nano-imprint. The template 705 is defined by a pattern that when pressed into the film transfers the pattern to the film to form the optical structure 710. In some embodiments, the pattern is to make a grating for the coupling element 350, the directing element 360, and/or the decoupling element 365.

FIG. 8 illustrates an embodiment of masking a photoresist. In some embodiments, a photoresist 805 is used in lieu of, in addition to, or in combination with an imprint resist as described in FIG. 7. The photoresist 805 is spun onto a substrate 715. A mask 810 is used to expose a pattern in the photoresist 805. The photoresist is developed and/or etched to form an optical structure based on the pattern (e.g., a diffraction grating).

In some embodiments, the photoresist 805 is a polymer that comprises a photoacid generator. The photo acid generator forms a strong acid compound during an initial lithography step and/or during a subsequent exposure step. Absorbance of the photoacid generator and an exposure wavelength can be tuned to activate the photoacid generator during the initial lithography step and/or during the subsequent exposure step. In some embodiments, electron-beam lithography is used to form the pattern in the photoresist in lieu of, or in addition to, using the mask 810.

In some embodiments, the photoresist 805 contains a reactive monomer, such as tert-butoxy acrylate, that can be deprotected with strong acid during an annealing step (~100° C.). The reaction between the monomer and strong acid produces a residual reactive functional group (such as a carboxylic acid), which is capable of selectively reacting with a high refractive index compound, such as titanium butoxide, in a later processing step.

Figure 9:
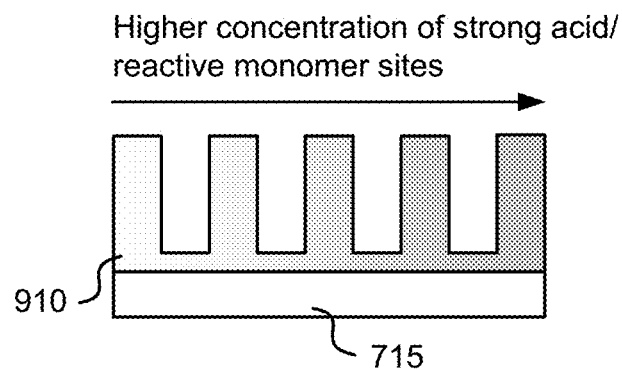
FIG. 9 illustrates an embodiment of a gradient of concentrations of a strong acid in an optical structure.

FIG. 9 illustrates an embodiment of a gradient of concentration of a strong acid in an optical structure 910. The optical structure 910 is a on a substrate 715. In some embodiments, the optical structure 910 is formed from a film (e.g., using an imprint resist as described in FIG. 7 and/or using a photoresist as described in FIG. 8). The concentration of strong acid is lower on the left (lighter in the figure) and higher on the right (darker in the figure).

To obtain the gradient of concentrations of the strong acid, the optical structure 910 was exposed to an energy gradient. The energy gradient can be a thermal gradient and/or an optical gradient. A refractive-index gradient is formed in the structure 910 based on exposing the optical structure 910 to the energy gradient.

In some embodiments, the optical structure 910 is exposed to a gradient of light. The gradient of light exposes the optical structure 910 to variable light doses (e.g., using gray-tone mask). By exposing the optical structure 910 to the gradient of light, the gradient of concentration of the strong acid is formed. The gradient of concentration of the strong acid produces a gradient of reactive functional groups during a later annealing step. As the strong acid is annealed, it reacts with a monomer to increase the refractive index of the film.

In some embodiments, the optical structure 910 is exposed to a uniform dose of light across the optical structure 910, but annealed at different temperatures using a thermal gradient hot plate. Since the extent of reaction between the strong acid and the reactive monomer depends on temperature, a concentration gradient of reactive functional groups is created that follows the temperature gradient from annealing. A shape of the concentration gradient of the strong acid can be adjusted by utilizing a photoresist with multiple reactive monomers that can be deprotected at different temperatures. In some embodiments, exposing the optical structure 910 to an energy gradient produces a better resolution gradient than using drops of resin from an inkjet.

Figure 10:
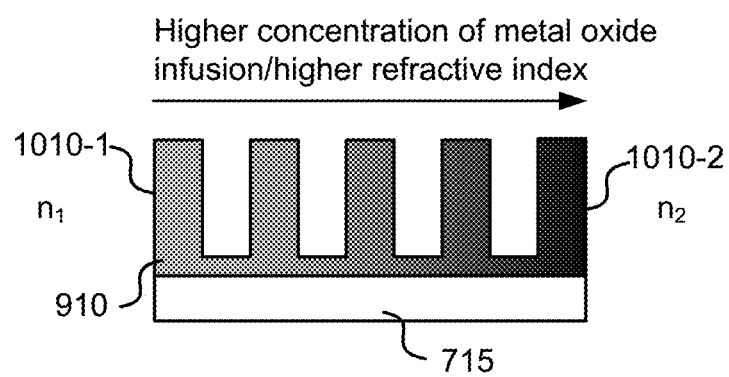
FIG. 10 illustrates an embodiment of the optical structure exposed to a compound.

FIG. 10 illustrates an embodiment of the optical structure 910 exposed to a compound. The compound has a higher refractive index than the film of the optical structure 910. The compound selectively reacts with the reactive functional groups. In some embodiments, the compound contains organometallic moieties, which are precursors to metal oxides such as titanium oxide, hafnium oxide, zirconium oxide, etc.

In some embodiments, the optical structure 910 is exposed to organometallic compounds in vapor phase and/or in liquid phase. For vapor phase reactions, the organometallic compound diffuses throughout a polymer matrix and reacts selectively with the deprotected monomer sites. For liquid phase reactions, the resist is exposed to an organometallic/solvent mixture, which is capable of swelling the resist without dissolving it. After exposure, the film of the optical structure 910 can be subsequently processed by annealing and/or exposure to water vapor to complete formation of metal oxide in the film. Because the refractive index of the metal oxide is higher than the film before processing, a refractive-index gradient is created in the optical structure 910.

The optical structure 910 is defined by a first end 1010-1 and a second end 1010-2. The optical structure 910 has a low refractive index $n_1$ and a high refractive index $n_2$. A refractive-index difference $\Delta n = n_2$ minus $n_1$. In some embodiments, the optical structure 910 in FIG. 10 has the following properties: $n_1$=1.4-1.6, 1.45-1.55, 1.5, and/or 1.5±3, 5, and/or 10%; $n_2$=1.65-1.85, 1.7-1.8, 1.75, and/or 1.75±3, 5, and/or 10%; and/or $\Delta n$=0.15-0.35, 0.2-0.3, and/or 0.25±3, 5, and/or 10%.

Figure 11:
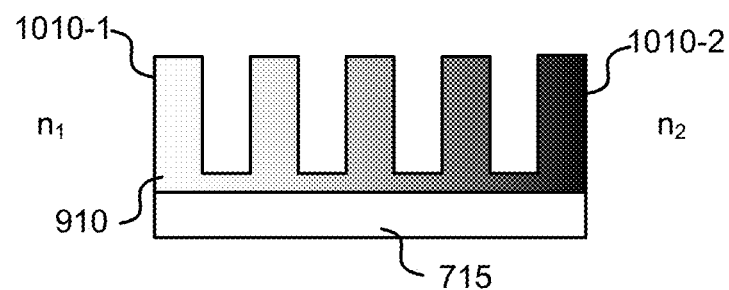
FIG. 11 illustrates an embodiment of an optical structure with a refractive-index gradient that is enhanced.

FIG. 11 illustrates an embodiment of an optical structure 910 with a refractive-index gradient that is enhanced. The refractive-index gradient of the optical structure 910 can be enhanced by one or more additional processing steps. In some embodiments, the optical structure 910 is exposed to flood UV light. The flood UV light de-protects remaining reactive monomers in the film of the optical structure 910. The flood UV light exposure is followed by a second deposition of a moiety having a lower refractive index (e.g., a fluorinated compound), which selectively reacts with sites created by the flood UV light exposure. The flood UV light exposure and deposition of the moiety increase the refractive index difference Δn, by lowering $n_1$.

In some embodiments, the refractive index of the film of the optical structure 910 is lowered by incorporating a depolymerizable oligomer or polymer into the film (e.g., poly(propylene glycol) or poly(phthalaldehyde)), which decomposes upon reaction with light or strong acid. Voids left in the film after the decomposition lower the refractive index of the film.

In some embodiments, $n_1$=1.25-1.45; 1.3-1.4, and/or 1.35±3, 5, and/or 10%; $n_2$ of FIG. 11=$n_2$ of FIG. 10; and/or Δn=0.35-0.45 and/or 0.4±3, 5, and/or 10%. In some embodiments, an optical device is characterize by a first end 1010-1, a second end 1010-2 opposite the first end, and/or a refractive index change. In some embodiments, the refractive index change is a monotonic function. In some embodiments, the optical device is on a substrate 715. In some embodiments, the optical device is a grating.

Figure 12:
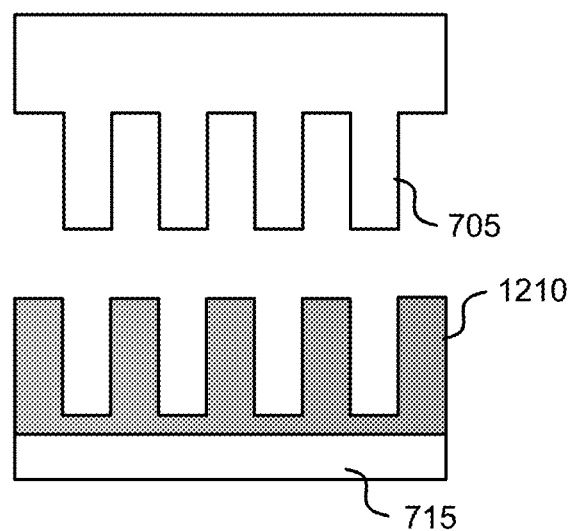
FIG. 12 illustrates an embodiment of an imprint resist comprising a sol-gel precursor.

FIG. 12 illustrates an embodiment of an imprint resist comprising a sol-gel precursor. A film 1210 is applied to a substrate 715. The film comprises a sol-gel precursor. In some embodiments, the film comprises a monomeric or polymeric resist containing a metal oxide sol-gel precursor, such as titanium butoxide. The film 1210 is patterned using the template 705 to form an optical structure (e.g., a grating). In some embodiments, the film 1210 is patterned using photolithography and/or electron-beam lithography (e.g., as described in FIG. 8).

Figure 13:
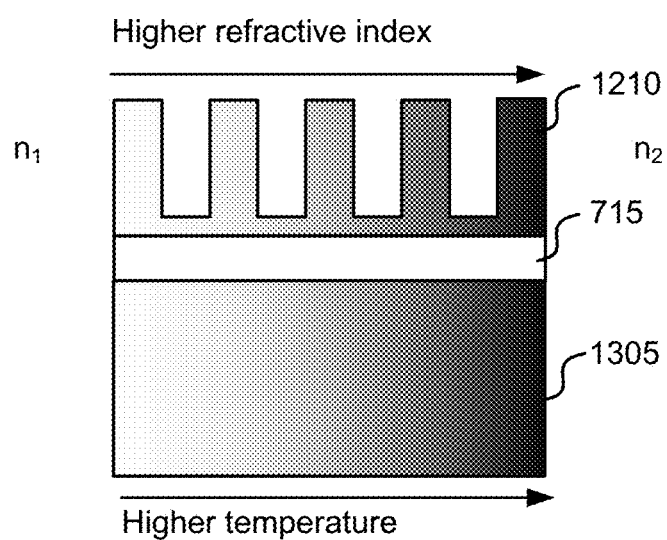
FIG. 13 illustrates the imprint resist comprising the sol-gel precursor exposed to a thermal gradient.

FIG. 13 illustrates the imprint resist comprising the sol-gel precursor exposed to a thermal gradient. The substrate 715 is put in thermal contact with a hot plate 1305. The film is subsequently baked using the hot plate 1305 having a thermal gradient. In regions of the film 1210 baked at higher temperatures, an extent of the sol-gel reaction is greater and produces higher concentrations of high refractive index metal oxide. The metal oxide concentration gradient directly produces a refractive index gradient in the film 1210.

Figure 14:
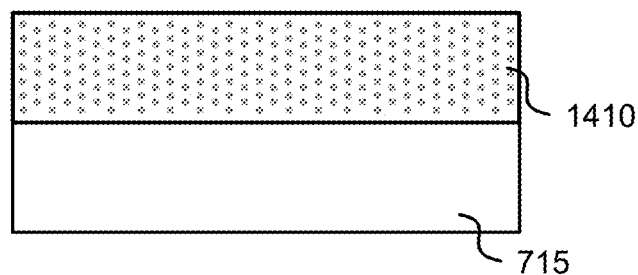
FIG. 14 illustrates an embodiment of a block copolymer film deposited on a substrate.

FIG. 14 illustrates an embodiment of a block copolymer film deposited on a substrate. A film 1410 is deposited on a substrate 715 (e.g., by spin coating). The film 1410 is a thin film of a block copolymer (BCP), such as poly(styrene-block-methylmethacrylate) (PS-b-PMMA). The film 1410 is annealed to produce self-assembled block copolymer domains (e.g., hexagonally-packed cylinders).

Figure 15:
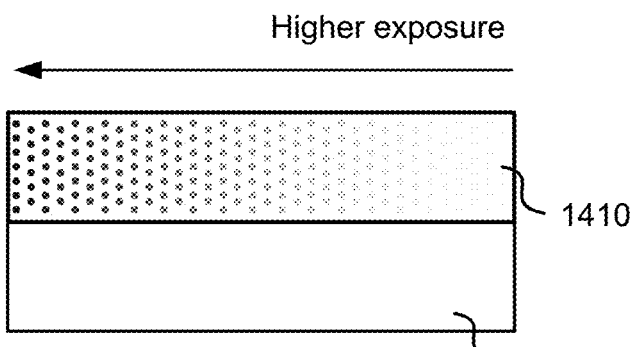
FIG. 15 illustrates an embodiment of developing domains in the block copolymer film exposed to UV light using a gray-tone mask.

FIG. 15 illustrates an embodiment of developing domains in the block copolymer film exposed to UV light using a gray-tone mask. The film 1410 is exposed to UV light, which decomposes the PMMA block and crosslinks the PS block. The UV exposure is done using a grey tone mask, which creates a gradient of exposure dose for the film 1410. The film 1410 is subsequently developed using a selective solvent for the degraded PMMA domains, such as acetic acid or isopropanol. In areas exposed to more UV light, more of the PMMA domains are developed. Voids left by the developed PMMA lowers the refractive index of the film 1410.

Figure 16:
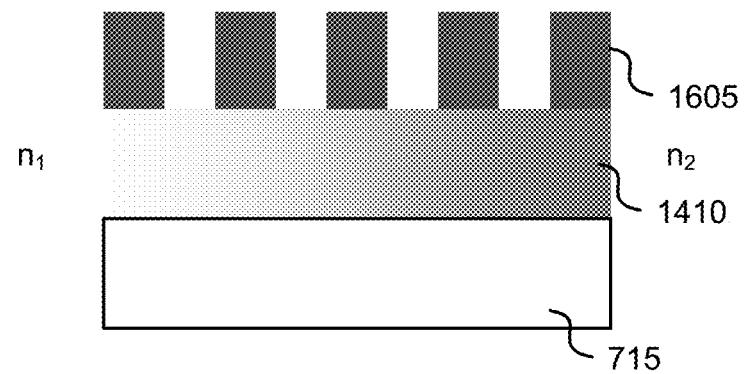
FIG. 16 illustrates an embodiment of a pattern of photoresist on the block copolymer film.

FIG. 16 illustrates an embodiment of a pattern of photoresist on the block copolymer film. The film 1410 can be converted into an optical structure by overcoating a photoresist 1605 or imprint resin, patterning the photoresist 1605 using photolithography, electron-beam lithography, and/or imprint lithography. In some embodiments, this process can also be generalized to other materials capable of generating a variable refractive index (e.g. sol-gel materials and films with depolymerizable moieties). In some embodiments, the sol-gel precursor is a metal alkoxide having the structure M+OR− (where M+ can be titanium, hafnium, zirconium, tantalum, niobium, aluminum, or other transition metals capable of forming alkoxides, and/or is an alkoxide with any isomer of methyl, ethyl, isopropyl, or butyl side chains); and/or a monomer is an acrylate or epoxide-functionalized carboxylic acid (such as acrylic acid) or β-keto ester.

Figure 17:
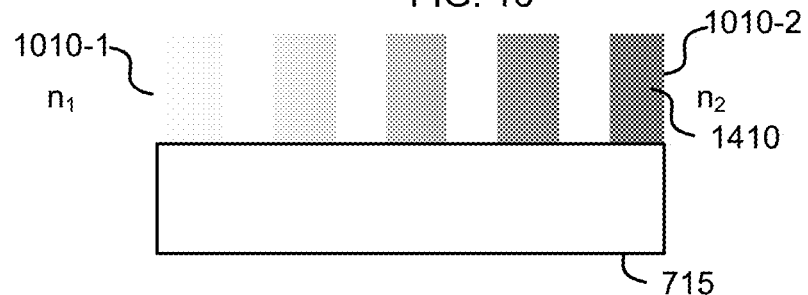
FIG. 17 illustrates an embodiment of the pattern of the photoresist transferred to the block copolymer film.

FIG. 17 illustrates an embodiment of the pattern of the photoresist transferred to the block copolymer film. The pattern of the photoresist 1605 is transferred to the film 1410 (e.g., by etching).

Figure 18:
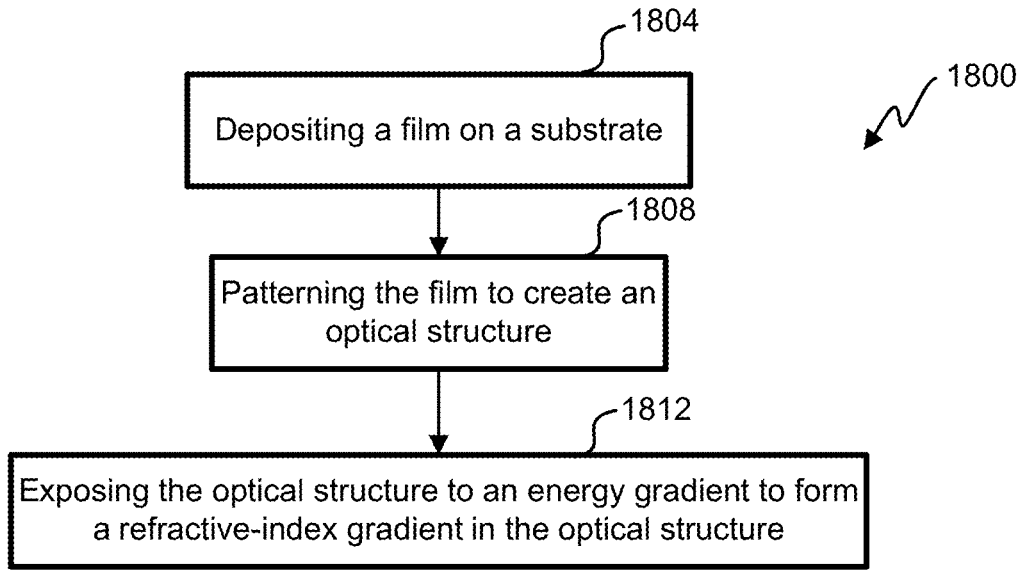
FIG. 18 illustrates an embodiment of a flowchart of a process for creating an optical device with a variable refractive index using an energy gradient.

FIG. 18 illustrates an embodiment of a flowchart of a process 1800 for creating an optical device with a variable refractive index using an energy gradient. Process 1800 begins in step 1804 with depositing a film on a substrate. Examples of film are given in descriptions corresponding to FIGS. 7, 8, 12, and 14. In step 1808, the film is patterned to create an optical structure. Examples of pattering a film to form an optical structure are given in descriptions corresponding to FIGS. 7, 8, 12, 16, and 17. In step 1812, the optical structure is exposed to an energy gradient to form a refractive-index gradient in the optical structure. Examples of energy gradients are light gradients and thermal gradients. Examples of exposing a structure and/or film to an energy gradient are given in descriptions corresponding to FIGS. 9-11, 13, and 15.

In some embodiments, the process 1800 further comprises exposing the optical structure to a compound as part of the process to form the refractive-index gradient; forming an overcoat on the optical structure; using a gray-tone mask and UV light to form a light gradient; exposing the film to flood UV light; depositing a moiety that has a lower refractive index than the film; and/or incorporating a depolymerizable oligomer or polymer into the film. In some embodiments, the compound has a higher refractive index than the film had before the film is exposed to the compound; the optical structure is a grating; the film is an imprint resist; the patterning the film comprises imprinting the film with a template to create the optical structure; the film is a photoresist; patterning the film comprises using photolithography to remove at least a portion of the film to form the optical structure; the film comprises a reactive monomer; the film comprises a photoacid generator; the energy gradient is a thermal gradient; the energy gradient is a light gradient; the film comprises a metal oxide sol-gel precursor; and/or the energy gradient is a thermal gradient produced by a hot plate. In some embodiments, the optical structure is a grating, and the method further comprises integrating the grating into a device used in a virtual reality and/or an augmented-reality system, wherein: the virtual reality and/or the augmented-reality system comprises: an optical source (e.g., source 410), a waveguide (e.g., output waveguide 320), an optical coupler (e.g., coupling element 350) configured to couple light from the optical source into the waveguide, and/or an output coupler (e.g., decoupling element 365) configured to couple light out of the waveguide; the waveguide is a planar waveguide; and/or the grating is part of the output coupler.

Figure 19:
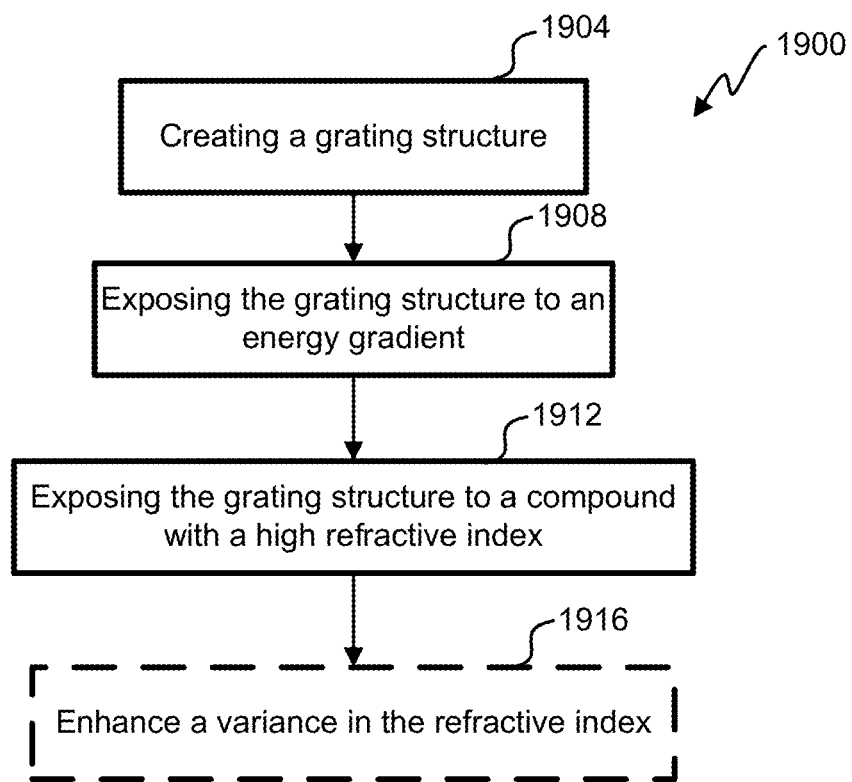
FIG. 19 illustrates an embodiment of a flowchart of a process for creating an optical device with a variable refractive index using lithography and infusion.

FIG. 19 illustrates an embodiment of a flowchart of a process 1900 for creating an optical device with a variable refractive index using lithography and infusion. Process 1900 begins in step 1904 with creating a grating structure (e.g., FIG. 7 and/or FIG. 8). In some embodiments, a template is used to define a grating structure in an imprint resist, and/or lithography is used define the grating structure. In some embodiments, the grating structure contains a reactive monomer, which can be de-protected with strong acid during annealing. In some embodiments, the grating structure comprises a photo-acid generator. The photo-acid generator can be activated by exposure to light.

In step 1908, the grating structure is exposed to an energy gradient. Exposing the grating structure to light and/or temperature de-protect sites. In some embodiments, the grating structure is exposed to a variable dose of light and/or to a uniform does of light and annealed to different temperatures (e.g., FIG. 9). In step 1912, the grating structure is exposed to a compound with a high refractive index. The compound reacts selectively with the de-protected sites to create a refractive index variance in the grating (e.g., FIG. 10).

In step 1916, the refractive index variance is optionally enhanced (e.g., FIG. 11) by one or more further steps. Examples of further steps to enhance the refractive index variance include: flood UV exposure, to de-protect remaining monomers; a deposition of low refractive index moiety, which selectively reacts with the de-protected sites produced by the flood UV exposure; and/or incorporating a depolymerizable oligomer or polymer into the film, which decomposes upon reaction with light or strong acid and voids (e.g., air) left after the reaction lower the refractive index of the grating structure because voids have a low refractive index (e.g., air refractive index is ~1).

Figure 20:
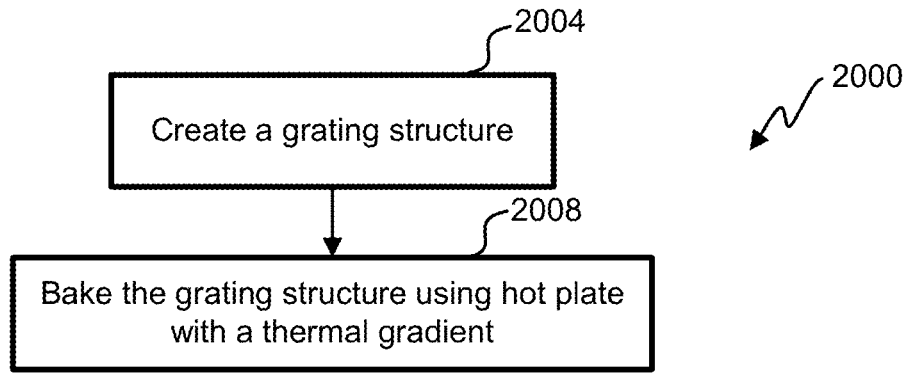
FIG. 20 illustrates an embodiment of a flowchart of a process for creating an optical device with a variable refractive index using lithography and a sol-gel precursor.

FIG. 20 illustrates an embodiment of a flowchart of a process 2000 for creating an optical device with a variable refractive index using lithography and a sol-gel precursor. Process 2000 begins in step 2004 with creating a grating in a film (e.g., FIG. 12). In some embodiments, the film is applied to a substrate and the grating structure is created using nano imprint, photolithography, and/or electron-beam lithography. The film comprises a sol-gel precursor.

In step 2108, the grating structure is baked (e.g., FIG. 13). The grating is baked using a hot plate with a temperature gradient. Areas of the grating structure exposed to higher temperatures produce higher concentrations of a metal oxide. The metal oxide has a higher refractive index than the film before baking.

Figure 21:
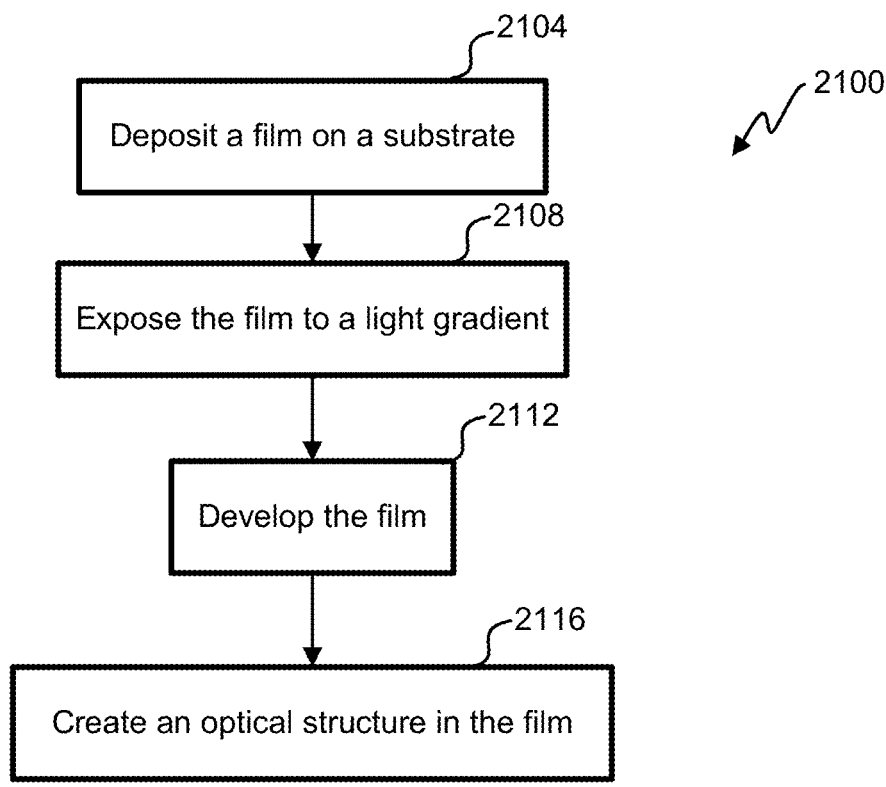
FIG. 21 illustrates an embodiment of a flowchart of a process for creating an optical device with a variable refractive index using lithography and block-copolymer degradation.

FIG. 21 illustrates an embodiment of a flowchart of a process 2100 for creating an optical device with a variable refractive index using lithography and block-copolymer degradation. Process 2100 begins in step 2104 with depositing a film on a substrate (e.g., FIG. 14). The film is a block copolymer. The film is exposed to a light gradient (e.g., FIG. 15). In some embodiments, a UV light with a gray-tone mask is used. In step 2112, the film is developed. In some embodiments, a selective solvent is used to develop the film. In areas exposed to more UV light, more PS-b-PMMA (poly styrene-block-methylmethacrylate) domains are developed. Voids left by the developed PMMA lower the refractive index. In step 2116, an optical structure is created in the film (e.g., FIGS. 16 and 17).

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure. For example, the energy gradient can be a gradient in two-dimensions (e.g., in a parabola shape). In some embodiments, a high-temperature tag (e.g., an acid generator) is put in the film. In some embodiments, a photo-base generator is put in and acid is generated everywhere. Light is shined from the second end 1010-2 to activate the acid. Light is shined from the first end 1010-1 to active the base.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of creating an optical device with a variable index of refraction for angular selectivity, the method comprising:
   depositing a film on a substrate;
   creating a grating in the film; and
   exposing the grating to an energy gradient, as part of a process to form a refractive-index gradient in the grating corresponding to the energy gradient.

2. The method of claim 1, further comprising exposing the grating to a compound as part of the process to form the refractive-index gradient.

3. The method of claim 2, wherein the compound has a higher refractive index than the film had before the film is exposed to the compound.

4. The method of claim 1, further comprising forming an overcoat on the grating.

5. The method of claim 1, wherein:
   the film is an imprint resist; and
   creating the grating in the film comprises imprinting the film with a template to create the grating.

6. The method of claim 1, wherein:
   creating the grating comprises using photolithography to remove at least a portion of the film to form the grating.

7. The method of claim 1, wherein the film comprises a reactive monomer.

8. The method of claim 1, wherein the film comprises a photoacid generator.

9. The method of claim 1, wherein the energy gradient is a thermal gradient.

10. The method of claim 1, wherein the energy gradient is a light gradient.

11. The method of claim 10, further comprising using a gray-tone mask and UV light to form the light gradient.

12. The method of claim 1, further comprising:
    exposing the film to flood UV light; and/or
    depositing a moiety that has a lower refractive index than the film.

13. The method of claim 1, further comprising incorporating a depolymerizable oligomer or polymer into the film.

14. The method of claim 1, wherein:
    the film comprises a metal oxide sol-gel precursor; and
    the energy gradient is a thermal gradient produced by a hot plate.

15. The method of claim 1, wherein:
    the method further comprises integrating the grating into a device used in a virtual reality and/or an augmented-reality system; and
    the virtual reality and/or the augmented-reality system comprises:
       an optical source,
       a waveguide,
       an optical coupler configured to couple light from the optical source into the waveguide, and
       an output coupler configured to couple light out of the waveguide;
    the waveguide is a planar waveguide; and
    the grating is part of the output coupler.

* * * * *